(12) United States Patent
He et al.

(10) Patent No.: US 8,060,849 B2
(45) Date of Patent: Nov. 15, 2011

(54) AUTOMATIC BUS ROUTING

(75) Inventors: Yanyan He, Cupertino, CA (US); Gary Lin, Cupertino, CA (US); Hung Nguyen, San Jose, CA (US); MingFu Gong, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 312 days.

(21) Appl. No.: 12/037,453

(22) Filed: Feb. 26, 2008

(65) Prior Publication Data

US 2009/0217230 A1      Aug. 27, 2009

(51) Int. Cl.
*G06F 17/50*   (2006.01)
(52) U.S. Cl. ........ 716/126; 716/111; 716/112; 716/130; 716/137; 716/139
(58) Field of Classification Search .................. 716/4, 5, 716/12–15, 110, 111, 112, 113, 114, 115, 716/126, 130, 137, 139
See application file for complete search history.

(56) References Cited

U.S. PATENT DOCUMENTS

| | | | |
|---|---|---|---|
| 5,847,968 A * | 12/1998 | Miura et al. | 716/8 |
| 6,253,364 B1 | 6/2001 | Tanaka et al. | |
| 6,256,769 B1 | 7/2001 | Tamarkin et al. | |
| 7,257,797 B1 | 8/2007 | Waller et al. | |
| 7,793,249 B1 * | 9/2010 | Wadland et al. | 716/12 |
| 2004/0025132 A1 * | 2/2004 | Valine | 716/11 |
| 2004/0250230 A1 * | 12/2004 | Itou et al. | 716/15 |
| 2005/0229138 A1 * | 10/2005 | Kitamura et al. | 716/13 |
| 2005/0235243 A1 * | 10/2005 | Hachiya et al. | 716/15 |

OTHER PUBLICATIONS

PCT International Search Report and the Written Opinion of the International Searching Authority for International Application No. PCT/US2009/034899, Apr. 14, 2009 pp. 1-7.
Cadence Design Systems, Inc. "Virtuoso Chip Assembly Router Datasheet," 2007, 4 pages.
Cadence Design Systems, Inc., "Virtuoso® Layout Editor User Guide," Sep. 2003, 924 pages.
MicroSim Corporation, "MicroSim PCBoards Autorouter User's Guide," Version 8.0, Jun. 1997, 135 pages.
Premkumar, "Accelerating Chip-Level Routing and Design," Sep. 2005, 9 pages.
Premkumar, "Automated Custom Physical Design (ACPD) Flow in Cadence IC5.0.x for Mixed-Signal Designs," downloaded from http://www.cdnusers.org/community/virtuoso/resources/tp_ACPDFlowforMSdesigns.pdf on May 25, 2010, 9 pages.

\* cited by examiner

*Primary Examiner* — Paul Dinh
*Assistant Examiner* — Nha Nguyen
(74) *Attorney, Agent, or Firm* — Klarquist Sparkman, LLP

(57) ABSTRACT

Particular embodiments generally relate to automatic routing of a bus in an integrated circuit design. In one embodiment, a method includes receiving a description of a circuit design. Buses are automatically detected based on pin adjacency in terms of distance between pins and routing layer of the pins. A bus routing area is determined by the bounding box of first group of source pins and a second group of destination pins. Bus routing guidance is then generated by an automatically search engine in the bus routing area. The bus routing guidance models a bus as a skinny wire with large spacing, and it does not violate design rules. Real bus wires are generated based on the bus guidance. A bus is then automatically routed between a first group of source pins and a second group of destination pins based on the bus routing guidance.

30 Claims, 8 Drawing Sheets

AUTOMATIC BUS ROUTING

BACKGROUND

Particular embodiments generally relate to automatic bus routing in electronic design automation (EDA).

In an integrated circuit, a bus is a group of signal nets with both their source pins and target pins located relatively close to each other. The bus is routed in a similar topology and obeys the integrated circuit layout design rules. The bus should be routed together and in parallel going through the same routing channel on the same routing layer and have about the same wire length. Because the bus includes multiple wires routed together, routing the bus may be harder than routing a single wire. Traditional signal routers route only one net at a time. The bus is routed manually by a user. For example, the user manually selects a routing path in the integrated circuit layout for each net individually until all the nets for the bus are routed. When there are a lot of buses to route, it becomes harder to route the buses manually in a time-efficient and accurate manner.

SUMMARY

Particular embodiments generally relate to automatic routing of a bus in an integrated circuit design. In one embodiment, a method includes receiving a description of a circuit design. One or more buses are automatically identified by geometry location adjacency of bus pins. A bus routing area is determined by a bounding box of a first group of source pins and a second group of destination pins. The order of source pins and destination pins may be different in term of pin locations. A design rule violation free bus routing guidance is generated by an area router within the bus routing area. The bus routing guidance models a bus as a skinny wire with a large routing space and reserves room for not yet routed pins. A real bus wire segment embedding is performed based on the bus guidance and the pin ordering and width and spacing requirements of design rules. Then the bus is automatically routed between a first group of source pins and a second group of destination pins.

A further understanding of the nature and the advantages of particular embodiments disclosed herein may be realized by reference of the remaining portions of the specification and the attached drawings.

DETAILED DESCRIPTION OF EMBODIMENTS

Figure 1:
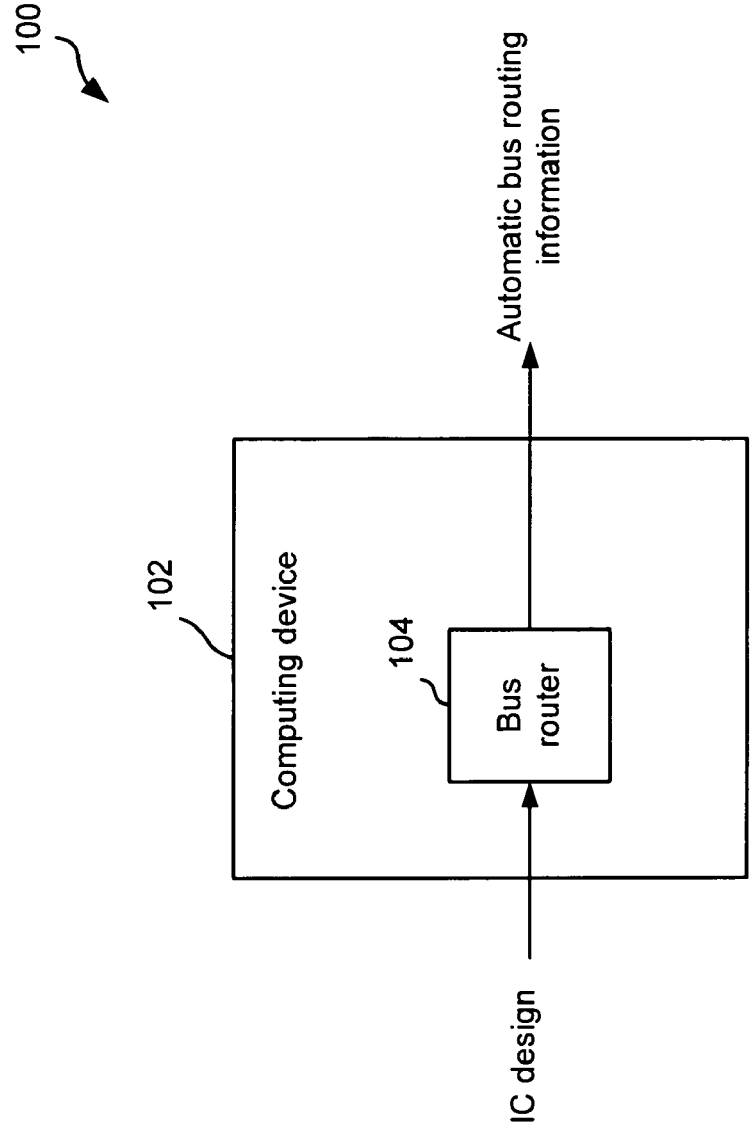
FIG. 1 depicts an example of a system for automatic bus routing according to one embodiment.

FIG. 1 depicts an example of a system 100 for automatic bus routing according to one embodiment. A computing device 102 may be used to perform the automatic bus routing. Computing device 102 may include a personal computer, work station, laptop computer, or any other computing device. Computing device 102 may also include a distributed set of computing devices.

An electronic design, such as of an integrated circuit, may be received by a bus router 104. The integrated circuit design may include a layout of the integrated circuit. In one example, a net-list of the integrated circuit design may be input to bus router 104. The net-list may include a listing of nets in the design. The net-list describes the connectivity of the electronic design and may include the instances, nets, and some attributes. In other embodiments, other descriptions of the circuit design may be received, such as descriptions provided in hardware description language (HDL).

Bus router 104 identifies buses that properly connect a group of nets in the layout of the design. Each net may include two or more pins. For example, a 2-pin net may include a source pin and a destination pin. The pins of the net may be connected by one or more wire segments. For example, source pins may be connected to destination pins. A bus may connect a group of nets using multiple wires. Bus router 104 may automatically route a bus between a group of source pins and target pins for the bus nets while obeying the design rules of the design. The wires of the bus nets are routed together and in parallel going through a substantially similar routing channel in the same routing layer and have about the same wire length. Bus router 104 routes the group of nets at one time and does not route the nets individually. This saves computing time in routing the bus. For example, search time may be saved because the group of nets is routed once. Also, a net ordering issue is avoided because the nets are routed as a group. If nets were routed individually, the ordered may become a problem because the routing of one net may block the pin of another net, making that net unroutable.

Figure 2:
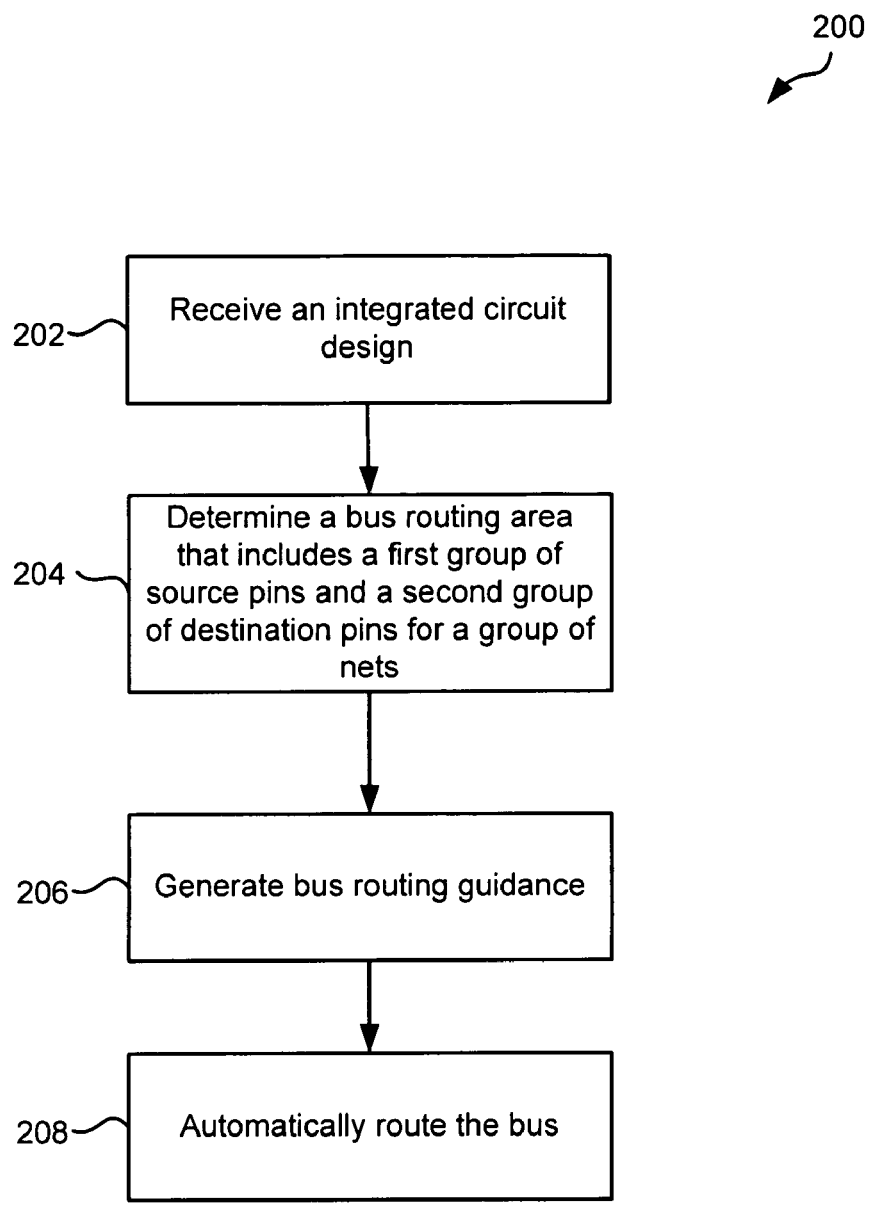
FIG. 2 depicts a simplified flowchart of a method for automatically routing a bus according to one embodiment.

FIG. 2 depicts a simplified flowchart 200 of a method for automatically routing a bus according to one embodiment. In step 202, bus router 104 receives an integrated circuit design. In one embodiment, the integrated circuit design may include a net-list and/or an integrated circuit layout.

In step 204, bus router 104 automatically identifies a bus. For example, bus router 104 determines a bus routing area that includes a first group of source pins and a second group of destination pins for a group of nets. In an integrated circuit design, a group of nets may be routed as a bus while a single net may be routed with single wire that does not follow the same path. For example, a group of nets that are located close to each other may be determined to be eligible for bus routing. In one example, the bus definition is based on the distance between pins for nets. For example, if the group of pins of nets is adjacent in terms of a certain amount of distance between the pins, they may be determined as a potential group for bus routing. A user may also define a bus manually. For example, a user can also manually define an area where nets will be searched for possible bus routing. In some embodiments, buses may be routed manually and automatically. Bus router 104 may route both types of buses based on a priority, such as user defined buses are routed with higher priority than automatically identified buses.

A net may include two pins: a source pin and a destination pin. If a bus is used with a 2-pin per net design, pins are grouped into two sets—a source pin set and a target pin set. For example, a first group of nets includes a first source pin set and a second destination pin set and the second group of nets includes a second source pin set and a second destination pin set. The first source pin set is connected to the second destination pin set and the second source pin set is connected to the first destination pin set. 2-pin bus routing is performed between the source pins and the target pins of nets. For a multiple-pin set bus routing, bus routing can be achieved by recursively calling the two-pin bus routing. For example, if nets include more than two pins, the pins may be broken into two pin sets that may be each routed.

Also, in determining the best routing solution, a routing layer selection is performed. If the source pins or target pins are located close enough, then a single-layer bus routing may be performed. Otherwise, a multi-layer bus routing may be determined. Multi-layer bus routing is where the bus is routed through multiple layers of the design.

In step 206, bus router 104 generates bus routing guidance. The bus routing guidance models a bus's path in the bus routing area that does not violate design rules for the design. In one embodiment, the bus routing guidance models a bus as a skinny wire with large spacing. The large spacing may be an estimated half width of the finally routed bus. Although a skinny wire with large spacing is described, it will be understood that wires with the width of the bus and regular spacing may also be used to determine the bus routing guidance. The bus routing guidance provides a clean path for the bus such that following the bus guidance, the final implementation of the bus can meet the width and spacing requirements of the design rules.

In step 208, bus router 104 automatically routes the bus. In one embodiment, the bus is routed between the first group of source pins and the second group of destination pins based on the bus routing guidance. For example, wire segments are created following the bus routing guidance. In automatically routing the bus, wire segments for each net in the bus are assigned based on pin ordering and the width and spacing requirement for each net in the bus. The group of nets is routed together for the bus. In routing the bus, different routing mechanisms may need to be performed. For example, pin tapering may be provided when needed, vias may be added between wire segments if they are in different routing layers, and any other actions may be performed to automatically route the bus. Also, any design rule violations received for the bus routing may be fixed by performing steps 204 and 206 again.

Figure 3:
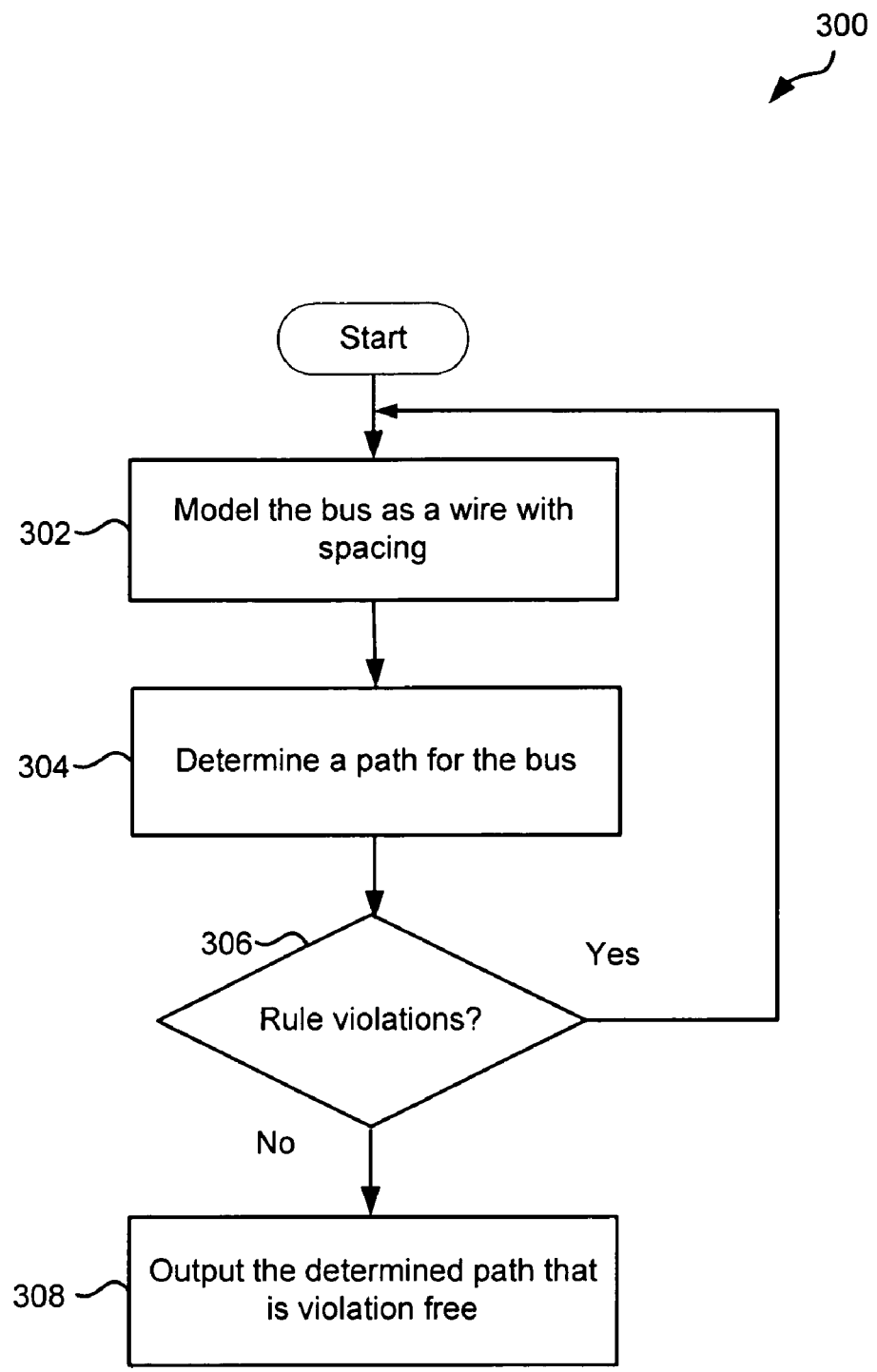
FIG. 3 depicts a simplified flowchart of a more detailed method for determining bus routing guidance according to one embodiment.

The steps of determining bus routing guidance and automatically routing the bus will now be described in more detail. FIG. 3 depicts a simplified flowchart 300 of a more detailed method for determining bus routing guidance according to one embodiment.

Step 302 models the bus path as a skinny wire with fat spacing. For example, wire segments are placed between the source pins and the destination pins of the nets. The amount of spacing used may depend upon the estimated final width of the bus.

Step 304 determines a path for the bus. For example, the single wire may be routed from the source pins to the destination pins.

Step 306 determines if there are any design rule violations. The design rule violations may take into account the spacing associated with the single wire. If the bus path has violations, the process reiterates to step 302 to model the bus through a different path. If the determined bus path is violation free, the method proceeds to step 308, which outputs the determined path that is violation free.

Figure 4:
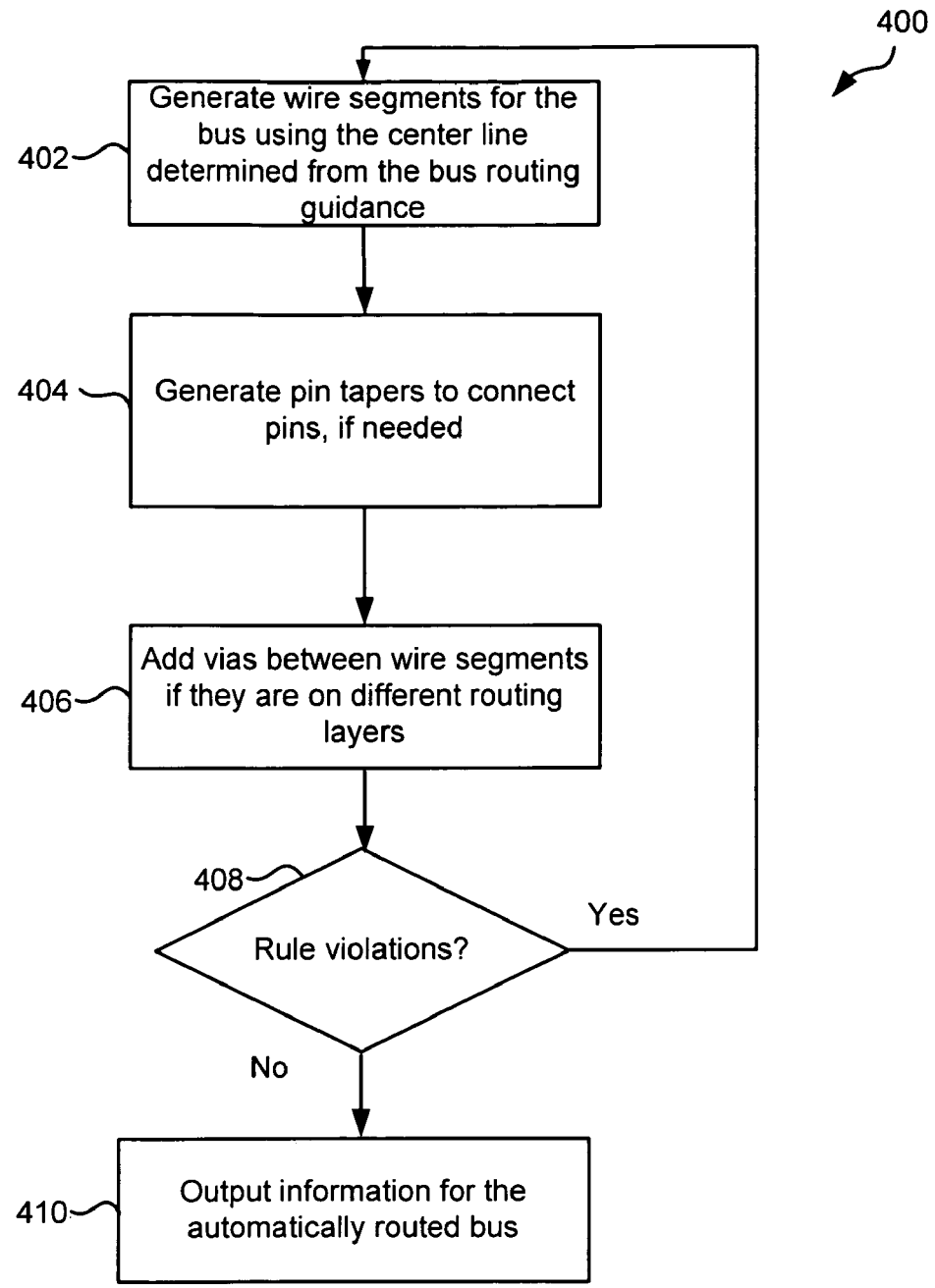
FIG. 4 depicts a simplified flowchart of a method for automatically routing the bus according to one embodiment.

FIG. 4 depicts a simplified flowchart 400 of a method for automatically routing the bus according to one embodiment. Step 402 generates wire segments for the bus using the center line determined from the bus routing guidance. The wire segments may connect the source pins to the destination pins. For example, if a bus contains 10 nets, 10 wires may be generated to connect 10 pins to each other. The contour outline of the 10 wires stays within the bus guidance boundary thus making sure there is no violation between bus and existing pre-routes.

The wire segment placement for each net in the bus is based on the pin ordering. Scrambling may be needed when the source pins and target pins do not follow the same geometrical order. For example, if a source pin in the first group of source pins corresponds to a destination pin that is not in the same order, then scrambling of the wires may be needed.

Figure 6:
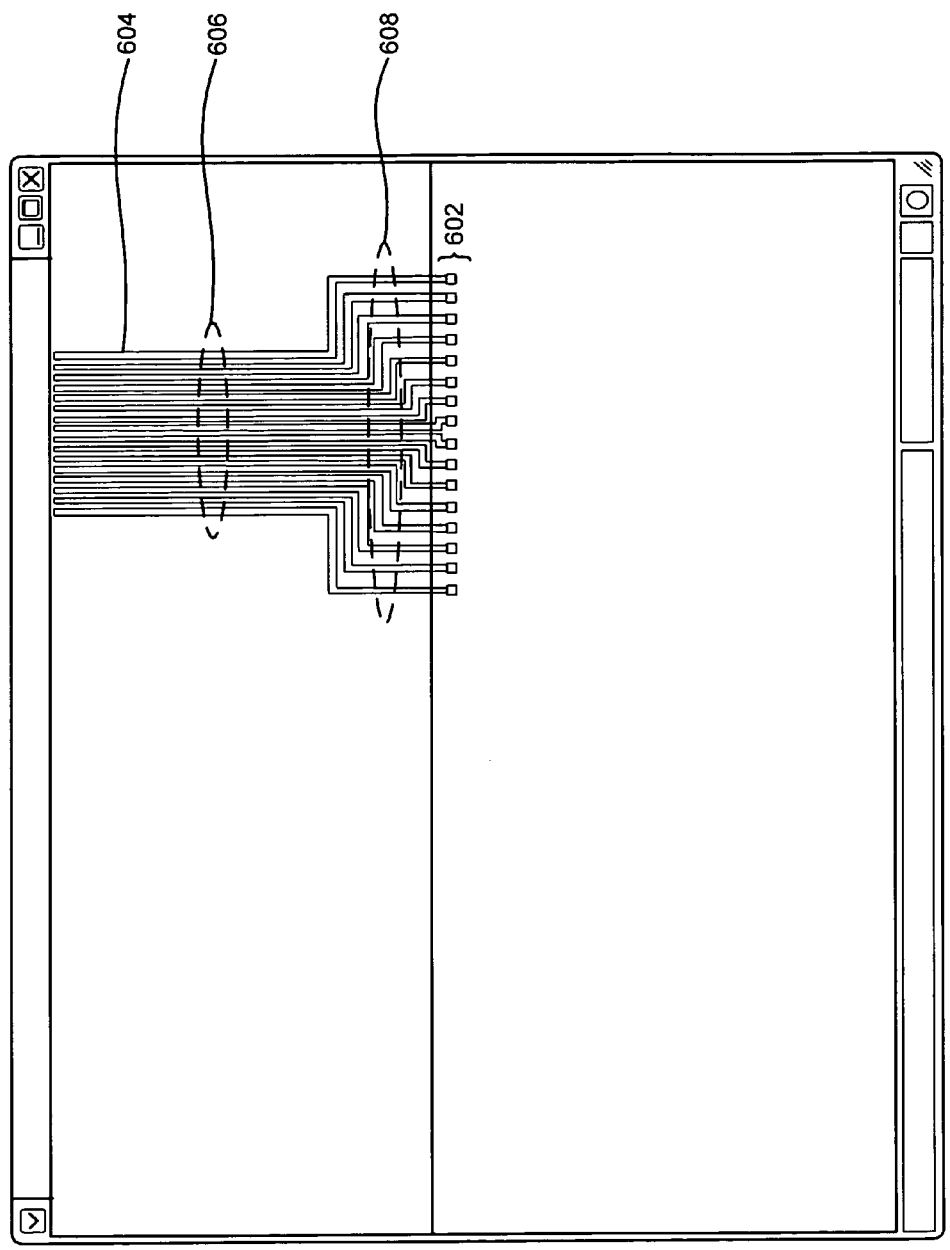
FIG. 6 shows an example of a situation when a pin taper is needed according to one embodiment.

Step 404 generates pin tapers to connect pins, if needed. The pin tapers may be needed when space between adjacent pins is not the same as the wire spacing. For example, if the wire spacing is narrower than the spacing of the pins, then the wires may need to be extended out to connect the pins. The determination of whether pin tapers are needed may be determined automatically. FIG. 6 shows an example of a situation when a pin taper is needed according to one embodiment. A group of pins 602 are shown. A bus 604 is routed to connect to pins 602. At 606, the width of bus 604 is less than the width at 608. This is because the spacing between pins 602 is more than the spacing of bus 604 at 606. Bus router 104 may calculate the difference in widths at 606 and 608 and determine that a pin taper is needed when the differences are above a threshold. Thus, it is automatically determined that a pin taper is needed for bus 604. The pin taper is inserted into the route and used to connect pins 602 to bus 604.

Figure 7:
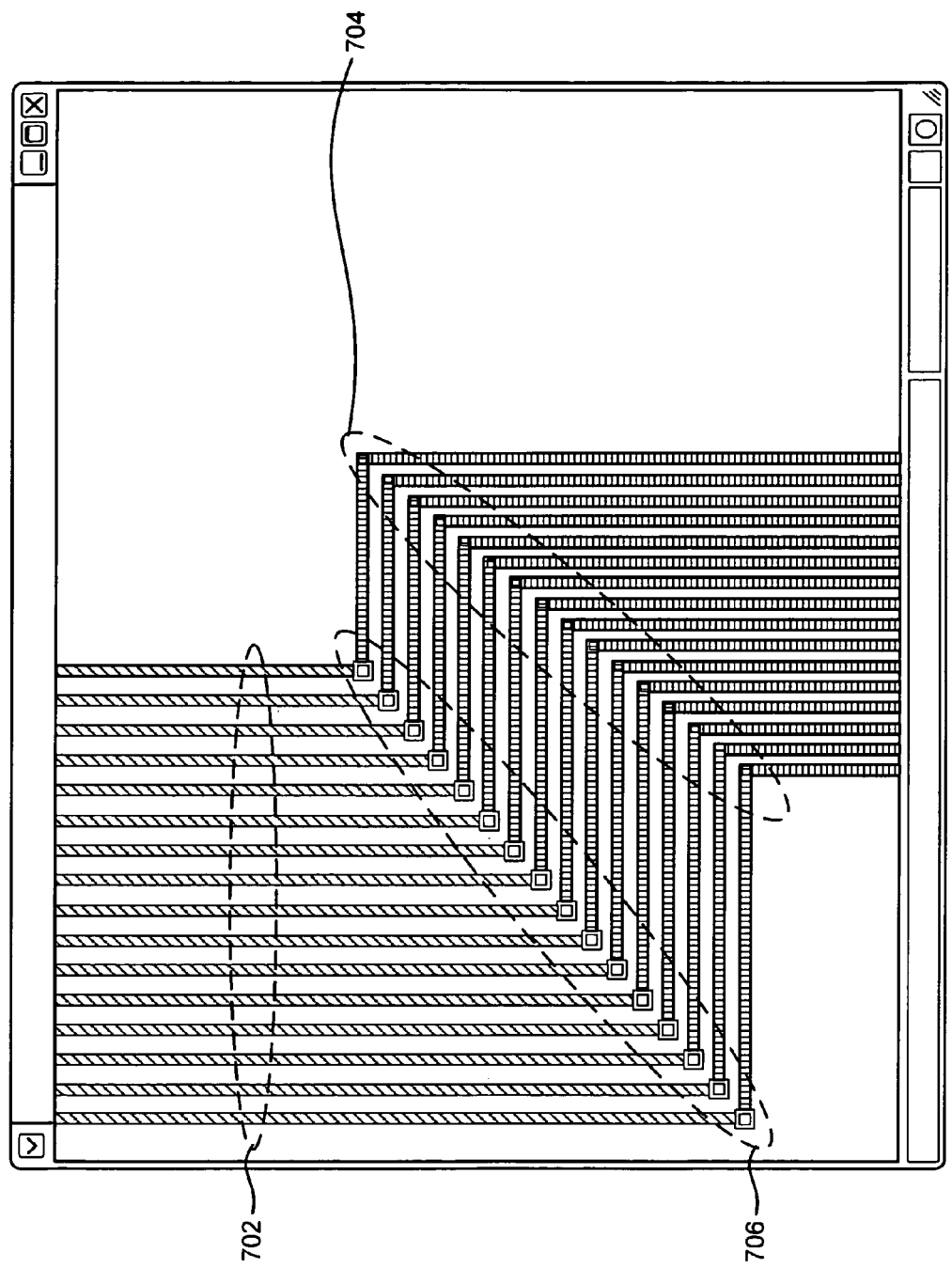
FIG. 7 shows an example where a via is needed according to one embodiment.

Step 406 adds vias between wire segments if they are on different routing layers. For example, some wire segments may be on different layers and a via may be needed. A via up or down may be added to connect the wire segments to make sure the bus is fully connected. FIG. 7 shows an example where a via is needed according to one embodiment. Wires 704 for the bus are placed on the metal 2 layer and wires 702 are being placed on a metal 3 layer. Because wires 702 and 704 are on different layer, they are disjoined. Thus, vias 706 are automatically inserted to make them fully connected. The determination to insert vias is determined automatically when wires of a bus are on a different layer that other wires. The wires are routed as a group and thus the vias are inserted in an adjacent area.

Step 408 then checks for violations. For example, the design rule violations that were checked above with respect to determining bus routing guidance may be used to see if the automatically-routed bus has any violations. If the design includes violations, the method reiterates to step 402 where the bus is automatically routed again. If the bus does not include any violations, the process proceeds to step 410, which outputs information for the automatically routed bus. For example, placement information for the wire segments is output. Accordingly, a bus may be routed using the above method.

Figure 8:
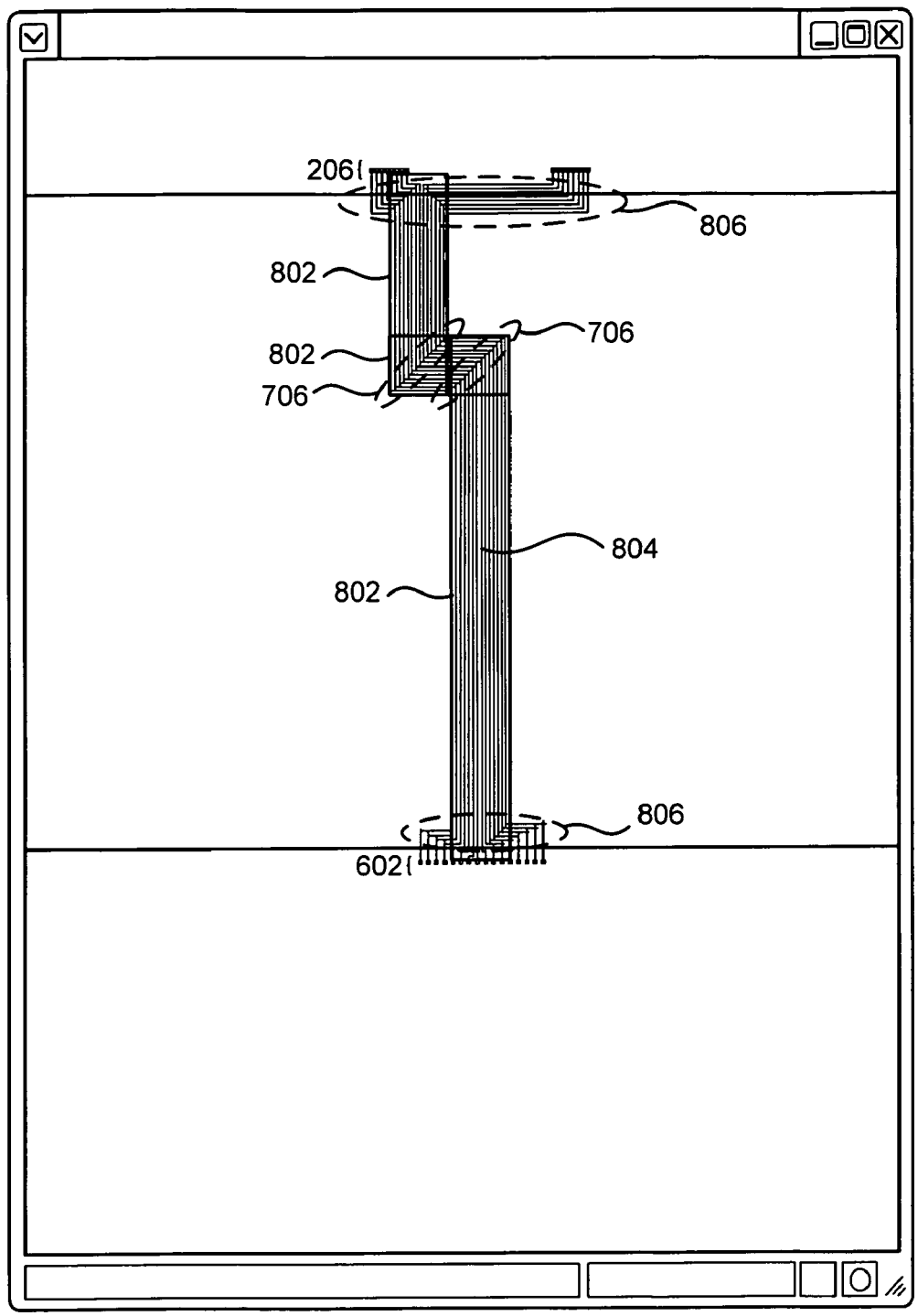
FIG. 8 shows an example of a routed bus and the bus guidance according to one embodiment.

FIG. 8 shows an example of a routed bus and the bus guidance according to one embodiment. Bus routing guidance 802 is shown and used to route bus 804. Bus 804 is placed based on the width and space requirement of bus routing guidance 802. The wire segments are laid out based on the guidance and at the same time. As shown, a pin taper 806 has been inserted to account for a larger width of pins 602. Also, vias 706 have been inserted to make the wires fully connected.

Figure 5:
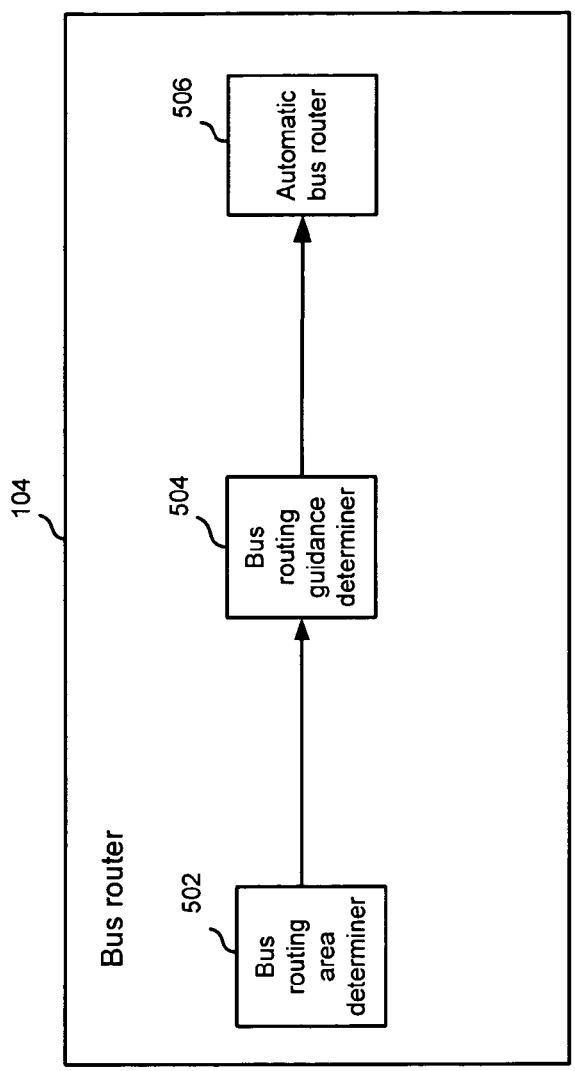
FIG. 5 shows a more detailed example of a bus router according to one embodiment.

FIG. 5 shows a more detailed example of bus router 104 according to one embodiment. A bus routing area determiner 502 receives an integrated circuit design. For example, a net-list and/or layout may be received. Bus identifier 502 automatically identifies nets that may be used as potential groups for a bus. The groups of nets may be output to a bus router 504.

Bus routing guidance determiner 504 is configured to determine routing guidance for a bus that does not violate design rules. For example, a single wire with spacing may be used to determine a bus routing path. The bus routing path is then output to an automatic bus router 506.

Automatic bus router 506 automatically routes the bus based on the routing guidance. In routing the bus, a pitch calculation may be performed. For example there are two nets, netA and netB, and they are routed next to each other. The pitch between netA and netB is calculated by: the pitch of netA=maximum of wire width of netA on the particular layer and via width of netA on that particular layer+spacing of netA on the particular layer and the pitch of netB=maximum of wire width of netB on the particular layer and via width of netB on that particular layer+spacing of netB on the particular layer. The final pitch between netA and netB is the maximum of pitch of netA and pitch of netB. The pitch calculated may be used in routing the bus. Also, pin tapering, and via placement may be automatically performed as necessary. After routing the bus, any violations that occur by automatically routing the bus may be fixed.

Although the description has been described with respect to particular embodiments thereof, these particular embodiments are merely illustrative, and not restrictive.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

A "computer-readable medium" for purposes of particular embodiments may be any medium that can contain, store, communicate, propagate, or transport the program for use by or in connection with the instruction execution system, apparatus, system, or device. The computer readable medium can be, by way of example only but not by limitation, an electronic, magnetic, optical, electromagnetic, infrared, or semiconductor system, apparatus, system, device, propagation medium, or computer memory. Particular embodiments can be implemented in the form of control logic in software or hardware or a combination of both. The control logic, when executed by one or more processors, may be operable to perform that which is described in particular embodiments.

Particular embodiments may be implemented by using a programmed general purpose digital computer, by using application specific integrated circuits, programmable logic devices, field programmable gate arrays, optical, chemical, biological, quantum or nano-engineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, a latitude of modification, various changes and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim:

1. A method, comprising:
receiving a description of a circuit design;
using a computer, automatically identifying a bus in the circuit design, the bus including a first group of source pins and a second group of destination pins for a plurality of nets of the bus in the circuit design, the nets including one or more multiple-pin nets comprising three or more pins, wherein the automatically identifying the bus comprises:
determining that one or more of the source pins or the destination pins are within a defined proximity of one another, and
for at least one of the multiple-pin nets, breaking the at least one multiple-pin net into two or more two-pin sets;
determining bus routing guidance for the bus, the bus routing guidance modeling a bus that does not violate design rules for routing a bus between the first group of source pins and the second group of destination pins; and
automatically routing a bus between the first group of source pins and the second group of destination pins based on the bus routing guidance for the plurality of nets, wherein the bus includes the two or more two-pin sets.

2. The method of claim 1, wherein a plurality of wires are routed as a group for the bus to connect the first group of source pins and the second group of destination pins for the plurality of nets.

3. The method of claim 1, wherein the determining bus routing guidance comprises:
determining the first group of source pins;
determining the second group of destination pins; and
searching for a design rule violation-free wire in a path between the first group of source pins and the second group of destination pins.

4. The method of claim 3, wherein the wire is a single wire with spacing.

5. The method of claim 1, wherein the automatically routing the bus comprises generating wire segments for the bus using the bus routing guidance.

6. The method of claim 5, wherein the automatically routing the bus comprises:
determining when a pin taper is needed to route the bus; and
generating pin tapers for the first group of source pins, the second group of destination pins, or the first group of source pins and the second group of destination pins.

7. The method of claim 5, wherein the automatically routing the bus comprises:
determining when one or more vias are needed to route the bus; and
adding the vias for the wire segments.

8. The method of claim 5, wherein the automatically routing the bus comprises checking the wire segments for violations of the design rules.

9. The method of claim 5, wherein the automatically routing the bus comprises:
analyzing the ordering of the first group of source pins and the second group of destination pins to make a determination that scrambling the wire segments is needed; and
based on the determination, generating scrambled wire segments for the bus.

10. The method of claim 1, wherein the determining bus routing guidance models a path for the bus as a wide wire with regular spacing.

11. The method of claim 1, wherein the determining bus routing guidance models a path for the bus as a skinny wire with large spacing.

12. The method of claim 1, wherein the automatically identifying a bus is based at least in part on the distance between pins for one or more of the nets.

13. The method of claim 1, wherein the bus routing guidance for the bus models one or more paths for the bus as a single wire having a width and a spacing, wherein the width and the spacing model design rules for two or more wires of the bus.

14. The method of claim 1, further comprising storing data representing wires, vias, or wires and vias for the routed bus in one or more computer-readable storage devices or memory.

15. The method of claim 1, further comprising fabricating a circuit design, the circuit design including wires, vias, or wires and vias for the routed bus.

16. The method of claim 1, wherein the routing the bus comprises recursively routing one or more of the two-pin sets.

17. The method of claim 1, wherein the routing is multi-layer routing.

18. One or more computer-readable storage devices or memory storing computer-readable instructions that when executed by one or more processors cause the processors to perform a method, the method comprising:
automatically identifying a bus of a circuit design including a first group of source pins and a second group of destination pins for a plurality of nets of the bus in the circuit design, wherein the automatically identifying the bus comprises determining that one or more of the source pins or the destination pins are adjacent to one another, the nets including one or more multiple-pin nets, each of the multiple-pin nets comprising three or more pins;
for at least one of the multiple-pin nets, breaking the at least one multiple-pin net into two or more two-pin sets;
determining bus routing guidance for the bus, wherein the bus, when routed using the guidance, does not violate design rules for routing a bus between the first group of source pins and the second group of destination pins; and
automatically routing a bus between the first group of source pins and the second group of destination pins based on the bus routing guidance for the plurality of nets, wherein the bus includes the two or more two-pin sets.

19. The computer-readable storage devices or memory of claim 18, wherein a plurality of wires are routed as a group for the bus to connect the first group of source pins and the second group of destination pins for the plurality of nets.

20. The computer-readable storage devices or memory of claim 18, wherein the method further comprise:
determining the first group of source pins;
determining the second group of destination pins; and
searching for a design rule violation-free wire in a path between the first group of source pins and the second group of destination pins.

21. The computer-readable storage devices or memory of claim 20, wherein the wire is a single wire with spacing.

22. The computer-readable storage devices or memory of claim 18, wherein the method further comprises generating wire segments for the bus using the bus routing guidance.

23. The computer-readable storage devices or memory of claim 22, wherein the method further comprises:
determining when a pin taper is needed to route the bus; and
generating pin tapers for the first group of source pins, the second group of destination pins, or the first group of source pins and the second group of destination pins.

24. The computer-readable storage devices or memory of claim 22, wherein the automatically routing the bus comprises:
determining when one or more vias are needed to route the bus; and
adding the vias for the wire segments.

25. The computer-readable storage devices or memory of claim 22, wherein the automatically routing the bus comprises checking the wire segments for violations of the design rules.

26. The computer-readable storage devices or memory of claim 18, wherein the bus routing guidance for the bus models one or more paths for the bus as a single wire having a width and a spacing, wherein the width and the spacing model design rules for two or more wires of the bus.

27. The computer-readable storage devices or memory of claim 18, wherein the routing the bus comprises recursively routing one or more of the two-pin sets.

28. The computer-readable storage devices or memory of claim 18, wherein the routing is multi-layer routing.

29. An apparatus, comprising:
one or more processors; and
one or more tangible media encoded with logic for execution by the one or more processors, wherein the logic, when executed by the processors, causes the processors to perform a method, the method comprising:
automatically identifying a bus of a circuit design including a first group of source pins and a second group of destination pins for a plurality of nets of the bus in the circuit design, wherein the automatically identifying the bus comprises determining that the source pins or the destination pins are within a defined proximity of one another, the nets including one or more multiple-pin nets comprising three or more pins,
determining bus routing guidance for the bus, the guidance modeling a bus that does not violate design rules for routing a bus between the first group of source pins and the second group of destination pins,
for at least one of the multiple-pin nets, breaking the at least one multiple-pin net into two or more two-pin sets,
automatically routing a bus between the first group of source pins and the second group of destination pins based on the bus routing guidance for the plurality of nets, wherein the routed bus includes the two or more two-pin sets.

30. The apparatus of claim 29, wherein the method further comprises: wherein the bus routing guidance for the bus models one or more paths for the bus as a single wire having a width and a spacing, wherein the width and the spacing model design rules for two or more wires of the bus.

* * * * *